(12) United States Patent
Atsuji

(10) Patent No.: US 11,715,661 B2
(45) Date of Patent: Aug. 1, 2023

(54) COMPOSITE SINTERED BODY AND METHOD OF MANUFACTURING COMPOSITE SINTERED BODY

(71) Applicant: NGK INSULATORS, LTD., Nagoya (JP)

(72) Inventor: Kyohei Atsuji, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/070,149

(22) Filed: Oct. 14, 2020

(65) Prior Publication Data
US 2021/0134639 A1    May 6, 2021

(30) Foreign Application Priority Data
Oct. 30, 2019   (JP) ................................ 2019-197719

(51) Int. Cl.
*H01B 1/02* (2006.01)
*H01L 21/683* (2006.01)

(52) U.S. Cl.
CPC .......... *H01L 21/6833* (2013.01); *H01B 1/02* (2013.01)

(58) Field of Classification Search
CPC .............. H01L 21/683; H01L 21/6833; H01L 21/6831; H01B 1/02; H01B 1/06; H02N 13/00; C04B 35/581; C04B 2235/3865; C04B 2235/9669; C04B 2235/3869; H05B 3/18
USPC ........................................................ 361/234
See application file for complete search history.

(56) References Cited

U.S. PATENT DOCUMENTS

| | | | |
|---|---|---|---|
| 6,133,557 A | 10/2000 | Kawanabe et al. | |
| 6,215,643 B1 * | 4/2001 | Nagasaki | H01L 21/6833 279/128 |
| 6,643,115 B2 | 11/2003 | Sakaue et al. | |
| 6,878,906 B2 | 4/2005 | Ito et al. | |
| 2005/0016986 A1 | 1/2005 | Ito | |
| 2005/0215073 A1 * | 9/2005 | Nakamura | H01L 21/67109 438/778 |
| 2005/0258160 A1 | 11/2005 | Goto et al. | |

(Continued)

FOREIGN PATENT DOCUMENTS

| | | |
|---|---|---|
| CN | 1596557 A | 3/2005 |
| JP | H08-236599 A1 | 9/1996 |

(Continued)

OTHER PUBLICATIONS

Taiwanese Office Action (Application No. 109135668) dated Jun. 7, 2021.

(Continued)

*Primary Examiner* — Danny Nguyen
(74) *Attorney, Agent, or Firm* — Burr Patent Law, PLLC

(57) ABSTRACT

A composite sintered body includes a base material (i.e., a main body) using ceramics as a main material and an electrode disposed inside the main body or on a surface thereof. The electrode contains WC and TiN. It is thereby possible to reduce the difference in thermal expansion coefficient between the electrode and the main body while suppressing an increase in the resistivity of the electrode. As a result, it is possible to suppress any damage such as a crack, a breakage, or the like of the main body, which is caused by the difference in the thermal expansion coefficient.

11 Claims, 2 Drawing Sheets

(56) References Cited

U.S. PATENT DOCUMENTS

| | | | |
|---|---|---|---|
| 2006/0011611 A1* | 1/2006 | Goto | H01L 21/67103 |
| | | | 219/444.1 |
| 2009/0159007 A1 | 6/2009 | Morooka | |
| 2013/0256297 A1 | 10/2013 | Nobori et al. | |
| 2014/0290863 A1 | 10/2014 | Watanabe et al. | |
| 2014/0340813 A1* | 11/2014 | Anada | H01L 21/6875 |
| | | | 361/234 |
| 2017/0251524 A1* | 8/2017 | Atsuji | H05B 3/265 |
| 2020/0207666 A1* | 7/2020 | Wang | H01L 21/6833 |

FOREIGN PATENT DOCUMENTS

| | | |
|---|---|---|
| JP | 2007-173592 A1 | 7/2007 |
| JP | 5032444 B2 | 9/2012 |
| KR | 10-2013-0110091 A | 10/2013 |
| TW | 200536425 A | 11/2005 |
| TW | 201336802 A | 9/2013 |

OTHER PUBLICATIONS

Korean Office Action (with English translation), Korean Application No. 10-2020-0134912, dated Jun. 15, 2022 (10 pages).
Taiwanese Patent Gazette, Taiwanese Patent No. 1764320, dated May 11, 2022 (3 pages).
Chinese Office Action, Chinese Application No. 202011160357.8, dated Jun. 3, 2023 (8 pages).

* cited by examiner

COMPOSITE SINTERED BODY AND METHOD OF MANUFACTURING COMPOSITE SINTERED BODY

BACKGROUND OF THE INVENTION

1. Field of Invention

The present invention relates to a composite sintered body and a method of manufacturing a composite sintered body.

CROSS-REFERENCE TO RELATED APPLICATION

This application claims priority benefit under 35 U.S.C. Section 119 of Japanese Patent Application No. 2019-197719 filed in the Japan Patent Office on Oct. 30, 2019, the entire disclosure of which is incorporated herein by reference.

2. Description of Related Art

In an apparatus of manufacturing a semiconductor substrate or the like, conventionally, used is a susceptor such as an electrostatic chuck which holds a semiconductor substrate by adsorption, a heater which heats a semiconductor substrate, an electrostatic chuck heater combining the electrostatic chuck and the heater, or the like. The susceptor includes a base material using a sintered body of ceramics (e.g., aluminum nitride) as a main material and an electrode disposed inside the base material or the like.

In the above-described manufacturing apparatus, processes such as film formation, etching, and the like using plasma generated by exciting a process gas are performed on a semiconductor substrate supported by the susceptor. In the susceptor, in order to adapt to a temperature rise in the above-described processes, for the purpose of maintaining the volume resistivity at high temperature, and the like, an additive such as magnesium oxide or the like is added to the base material in some cases. Since the thermal expansion coefficient of the base material varies depending on the kind of additive and the addition rate, there is a possibility that a crack, a breakage, or the like of the base material may occur due to the difference in thermal expansion coefficient between the base material and the electrode.

Then, Japanese Patent Application Laid-Open No. 8-236599 (Document 1) proposes that in a heating resistor embedded in a base material formed of an aluminum nitride sintered body, 1 to 10 weight percentage of aluminum nitride (i.e., a material of the base material) is mixed into 90 to 99 weight percentage of tungsten, molybdenum, tungsten carbide, titanium carbide, or titanium nitride, to thereby reduce the difference in the thermal expansion coefficient between the base material and the heating resistor.

Further, Patent Publication No. 5032444 (Document 2) proposes that in an electrode embedded in a ceramic base material such as aluminum nitride, aluminum oxide, yttrium oxide, or the like, 5 to 30 weight percentage of material of the ceramic base material is mixed into a refractory metal such as tungsten, molybdenum, or the like, to thereby reduce the difference in the thermal expansion coefficient between the base material and the electrode.

On the other hand, Japanese Patent Application Laid-Open No. 2007-173592 (Document 3) proposes a hyperbolic electrostatic chuck in which an adsorption electrode embedded in a ceramic dielectric layer formed of aluminum nitride is formed of a sintered body of molybdenum, tungsten, titanium, titanium nitride, tungsten carbide, or titanium carbide. In the electrostatic chuck, by defining the thickness of each portion of the ceramic dielectric layer, a wafer is uniformly fixed on an adsorption surface.

In Documents 1 and 2, though it is possible to reduce the difference in the thermal expansion coefficient between the base material and the electrode to some degree by adding the material of the base material to the electrode, there is a limit to reduction in the difference. Further, by adding the material of the base material to the electrode, there arises a possibility that the resistivity of the electrode may increase and the calorific value may decrease.

In the electrostatic chuck of Document 3, there is no consideration of reducing the difference in the thermal expansion coefficient between the ceramic dielectric layer and the adsorption electrode, to thereby suppress a crack, a breakage, or the like of the ceramic dielectric layer. Further, in a case where the electrode is formed of molybdenum, tungsten, or titanium in the electrostatic chuck, the electrode is easily affected by sintering conditions and the base material and occurrence of oxidation and carbonization easily causes ununiformity in the electrode. As a result, the electrode characteristics easily vary and there is a possibility that the mass productivity may be reduced. On the other hand, in a case where the electrode is formed of titanium nitride, there is a possibility that due to high-temperature sintering performed in manufacture of the electrostatic chuck, abnormal grain growth of titanium nitride occurs and voids are generated among particles, to thereby cause an increase in the resistivity of the electrode.

SUMMARY OF THE INVENTION

The present invention is intended for a composite sintered body, and it is an object of the present invention to reduce a difference in thermal expansion coefficient between an electrode and a base material while suppressing an increase in resistivity of the electrode.

The composite sintered body according to one preferred embodiment of the present invention includes a base material using ceramics as a main material and an electrode disposed inside the base material or on a surface thereof. The electrode contains tungsten carbide (WC) and titanium nitride (TiN). It is thereby possible to reduce a difference in thermal expansion coefficient between the electrode and the base material while suppressing an increase in resistivity of the electrode.

Preferably, an absolute value of the difference in thermal expansion coefficient between the electrode and the base material is not higher than 0.3 ppm/° C. within a range not lower than 40° C. and not higher than 1000° C.

Preferably, the resistivity of the electrode at a room temperature is not higher than $3.0 \times 10^{-5}$ Ω·cm.

Preferably, the content percentage of the titanium nitride (TiN) in a conductor included in the electrode is not lower than 5 volume percentage and not higher than 60 volume percentage.

Preferably, the intensity ratio of main peak between the tungsten carbide (WC) and the titanium nitride (TiN), which is obtained by the X-ray diffraction method, is not lower than 0.80 and lower than 1.0 in the electrode.

Preferably, the total content percentage of the tungsten carbide (WC) and the titanium nitride (TiN) in a conductor included in the electrode is 100 volume percentage.

Preferably, the total content percentage of the tungsten carbide (WC) and the titanium nitride (TiN) in the electrode is 100 volume percentage.

Preferably, the sintered particle diameter of the titanium nitride (TiN) in the electrode is not smaller than 0.7 μm and not larger than 1.0 μm.

Preferably, the main material of the base material is aluminum nitride.

Preferably, the base material has a disk-like shape, and a semiconductor substrate is placed on a main surface of the base material.

The present invention is also intended for a method of manufacturing a composite sintered body.

The method of manufacturing a composite sintered body according to one preferred embodiment of the present invention includes a) preparing a first member and a second member each of which is a green body, a calcined body, or a sintered body, which uses ceramics as a main material, b) disposing an electrode or a precursor of the electrode including tungsten carbide (WC) and titanium nitride (TiN) on the first member and then forming a layered body by layering the second member thereon, and c) performing hot-press sintering of the layered body. It is thereby possible to reduce a difference in thermal expansion coefficient between the electrode and the base material while suppressing an increase in resistivity of the electrode.

Preferably, an absolute value of the difference in thermal expansion coefficient between the electrode and the first member and the second member after the end of the operation c) is not higher than 0.3 ppm/° C. within a range not lower than 40° C. and not higher than 1000° C.

Preferably, a sintering temperature in the operation c) is not lower than 1700° C. and not higher than 1780° C.

These and other objects, features, aspects and advantages of the present invention will become more apparent from the following detailed description of the present invention when taken in conjunction with the accompanying drawings.

DETAILED DESCRIPTION OF THE INVENTION

Figure 1:
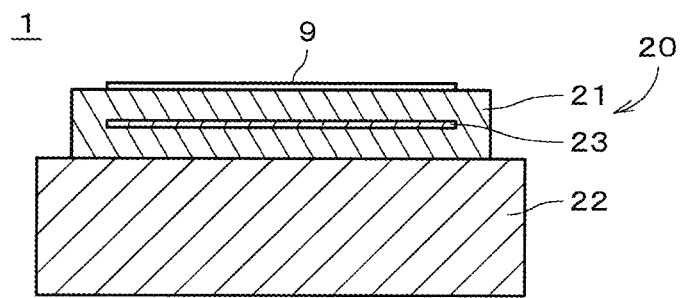
FIG. 1 is a cross section showing a susceptor.

FIG. 1 is a cross section showing a susceptor 1 in accordance with one preferred embodiment of the present invention. The susceptor 1 is a semiconductor manufacturing apparatus member used in a semiconductor manufacturing apparatus. The susceptor 1 supports a substantially disk-like semiconductor substrate 9 (hereinafter, referred to simply as a "substrate 9") from the lower side of FIG. 1. In the following description, the upper side and the lower side of FIG. 1 will be referred to simply as an "upper side" and a "lower side", respectively. Further, the up-and-down direction of FIG. 1 will be referred to simply as an "up-and-down direction". The up-and-down direction of FIG. 1 does not necessarily have to coincide with an actual up-and-down direction in a case where the susceptor 1 is placed on the semiconductor manufacturing apparatus.

The susceptor 1 includes a main body 21, a base part 22, and an electrode 23. The main body 21 is a base material which has a substantially plate-like shape (for example, substantially disk-like shape) and uses ceramics as a main material. On an upper main surface (i.e., an upper surface) of the main body 21, the substrate 9 is placed. The base part 22 is a member having a substantially plate-like shape (for example, substantially disk-like shape) larger than that of the main body 21 in a plan view. The main body 21 is attached on the base part 22. In the exemplary case shown in FIG. 1, the electrode 23 is disposed inside (in other words, embedded in) the main body 21. The electrode 23 is, for example, a member having a substantially disk-like shape. It is preferable that the electrode 23 should be formed of a material having relatively high melting point. The main body 21 and the electrode 23 are composite sintered bodies formed of a plurality of materials. In the following description, the main body 21 and the electrode 23 are also collectively referred to as a "composite sintered body 20". Materials for the main body 21 and the electrode 23 will be described later.

In the exemplary case shown in FIG. 1, the susceptor 1 is a heater for heating the substrate 9 by heat generated by applying a direct-current voltage to the electrode 23. In other words, the electrode 23 is a resistance heating element for heating the substrate 9. In the susceptor 1, a chuck electrode which electrostatically adsorbs the substrate 9 by using the Coulomb force or the Johnsen-Rahbek force may be provided inside the main body 21, additionally to the electrode 23. Alternatively, the electrode 23 may be used as the chuck electrode.

As described above, the main body 21 is formed of ceramics as a main material. In the main body 21, the content percentage of the ceramics as a main material is, for example, 50 to 100 mass percentage. The main material of the main body 21 is, for example, aluminum nitride (AlN). In the main body 21, an additive material such as magnesium oxide (MgO), magnesium aluminum spinel ($MgAl_2O_4$), and/or the like may be added to AlN. In the main body 21, the content percentage of AlN which is a main material is, for example, 50 to 100 mass percentage, and the content percentage is adjusted in accordance with desired material characteristics of the main body 21. In a case where high thermal conductivity is required of the main body 21, for example, the content percentage of AlN is preferably 80 to 100 mass percentage.

The electrode 23 includes a conductor, and the conductor contains tungsten carbide (WC) and titanium nitride (TiN). In the present application, the description of "tungsten carbide" refers to a compound represented by the chemical formula "WC" and has a concept not including a later-described compound represented by the chemical formula "$W_2C$". The total content percentage of WC and TiN in the conductor is, for example, 90 to 100 volume percentage. Further, the total content percentage of WC and TiN in the electrode 23 is, for example, 80 to 100 volume percentage, and heterogenous phase such as $W_2C$ or the like may be permissibly contained therein only if the content amount thereof produces substantially no effect on the performance of the electrode 23. In the present preferred embodiment, the electrode 23 is substantially formed only of the conductor, and the conductor does not substantially contain any substance other than WC or TiN. In other words, in the present preferred embodiment, the total content percentage of WC and TiN in the conductor included in the electrode 23 is 100 volume percentage, and the total content percentage of WC and TiN in the electrode 23 is also 100 volume percentage.

The content percentage of TiN in the conductor included in the electrode 23 is, for example, not lower than 5 volume percentage and not higher than 60 volume percentage and is adjusted so that the difference in the thermal expansion coefficient between the electrode 23 and the main body 21 can substantially approximate to 0. Further, in the electrode 23, the intensity ratio of main peak between WC and TiN (hereinafter, also referred to as a "WC—TiN peak ratio"), which is obtained by the X-ray diffraction method (XRD), is, for example, not lower than 0.80 and lower than 1.0 and is adjusted so that the difference in the thermal expansion coefficient between the electrode 23 and the main body 21 can substantially approximate to 0. The WC—TiN peak ratio is a value obtained by dividing the main peak intensity of WC by the total of the main peak intensity of WC and that of TiN.

The thermal expansion coefficient (also referred to as the "thermal expansion") of WC is lower than the thermal expansion coefficient of the main body 21 and lower than that of AlN which is a main material of the main body 21. The thermal expansion coefficient of TiN is higher than the thermal expansion coefficient of the main body 21 and higher than that of AlN which is a main material of the main body 21. An absolute value of the difference (hereinafter, also referred to as a "CTE difference") in the thermal expansion coefficient between the electrode 23 and the main body 21 is, for example, not higher than 0.5 ppm/° C., and preferably not higher than 0.3 ppm/° C. within a range not lower than 40° C. and not higher than 1000° C. The lower limit of the CTE difference is not particularly restricted but the CTE difference is not lower than 0.0 ppm/° C. Further, the resistivity of the electrode 23 at a room temperature is, for example, not higher than $3.0 \times 10^{-5}$ Ω·cm, and preferably not higher than $2.5 \times 10^{-5}$ Ω·cm. The lower limit of the resistivity is not particularly restricted but the resistivity is, for example, not lower than $1.0 \times 10^{-5}$ Ω·cm.

The electrode 23 is a sintered body which is formed by sintering, together with the main body 21 or separately from the main body 21, as described later. The sintering temperature is high, for example, not lower than 1700° C. Further, the melting point of WC is 2870° C. and that of TiN is 2930° C. The sintered particle diameter of TiN is, for example, not smaller than 0.7 μm and not larger than 1.0 μm, and preferably not smaller than 0.7 μm and not larger than 0.9 μm. The sintered particle diameter of TiN can be obtained by microstructure observation using the SEM (Scanning Electron Microscope) or the like.

Figure 2:
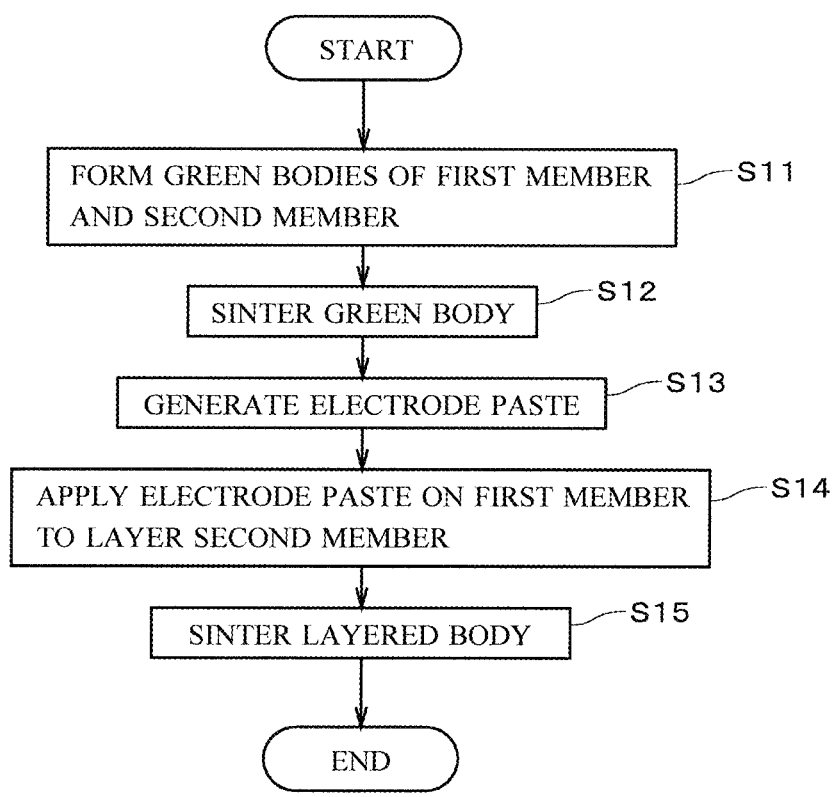
FIG. 2 is a flowchart showing an operation flow for manufacturing a composite sintered body.

Next, with reference to FIG. 2, an exemplary method of manufacturing the main body 21 and the electrode 23 (i.e., the composite sintered body 20) of the susceptor 1 will be described. In this exemplary method, a substantially disk-like portion (hereinafter, referred to as a "first member") which corresponds to a lower half of the main body 21 and another substantially disk-like portion (hereinafter, referred to as a "second member") which corresponds to an upper half thereof are formed and sintering is performed with a material of the electrode 23 sandwiched between the first member and the second member, and the main body 21 and the electrode 23 are thereby manufactured.

Specifically, first, the raw material powder of the main body 21 (i.e., the first member and the second member) is weighed so as to have a predetermined composition and wet-mixed, and then a green body is formed in a predetermined shape by uniaxial pressing or the like (Step S11). The green body formed in Step S11 is a precursor of the first member and the second member described above.

In Step S11, as an AlN raw material, for example, commercially-available high-purity fine powder is used. Further, in a case where the main body 21 contains MgO, as a MgO raw material, for example, commercially-available high-purity fine powder is used. In a case where the main body 21 contains $MgAl_2O_4$, for example, a mixture obtained by heating synthesis of the above-described commercially-available MgO powder and commercially-available high-purity fine powder of aluminum oxide ($Al_2O_3$) is used as a $MgAl_2O_4$ raw material. Alternatively, as the $MgAl_2O_4$ raw material, commercially-available high-purity fine powder of $MgAl_2O_4$ may be used. The purity, the average particle diameter, and the like of each of the AlN raw material, the MgO raw material, and the $MgAl_2O_4$ raw material are determined as appropriate.

In Step S11, mixing conditions (for example, mixing time, the kind of solvent, and the like) of the raw material powder are determined as appropriate. As the solvent, for example, an organic solvent or ion exchange water can be used. Further, in Step S11, the raw material powder may be mixed by dry mixing.

In Step S11, molding conditions of the green body (for example, pressure to be applied and the like) are determined as appropriate. In a case where the green body has a plate-like shape, the green body may be formed by filling the raw material powder into a hot press die or the like. Formation of the green body may be performed by any one of various other methods only if the shape can be maintained. For example, a slurry after wet mixing may be molded into a green body having a predetermined shape by inpouring the slurry in a fluid state into a mold and then removing a solvent component.

Subsequently, the two green bodies (i.e., the respective precursors of the first member and the second member) formed in Step S11 are sintered by the hot-press method or the like, and by processing obtained sintered bodies into predetermined shapes, the first member and the second member are obtained (Step S12). Sintering conditions in Step S12 (for example, press pressure, sintering temperature, sintering time, and the like) are determined as appropriate. The sintering of the green bodies in Step S12 may be performed by any method other than the hot-press method.

Next, the raw material powder of the electrode 23 is weighed so as to have a predetermined composition and mixed, and then kneaded and mixed with a solvent, a binder, and the like, to thereby generate an electrode paste which is a precursor of the electrode 23 (Step S13). In Step S13, as the WC raw material and the TiN raw material, for example, commercially-available high-purity fine powder of WC and TiN is used. The purity, the average particle diameter, and the like of each of the WC raw material and the TiN raw material are determined as appropriate. The above-described mixing of the raw material powder is performed by, for example, wet mixing. Mixing conditions (for example, mixing time, the kind of solvent, and the like) of the raw material powder are determined as appropriate. As the solvent, for example, the organic solvent or the ion exchange water can be used. Further, in Step S13, the raw material powder may be mixed by dry mixing. In Step S13, the above-described solvent (for example, organic solvent) and the kind of binder which are kneaded and mixed with the raw material powder are determined as appropriate. Furthermore, Step S13 may be performed before Steps S11 and S12, or concurrently with Steps S11 and S12.

The electrode paste formed in Step S13 is applied on an upper surface of one (i.e., the first member) of sintered bodies formed in Step S12, in a predetermined shape by screen printing or the like. Then, after drying the electrode paste for a predetermined time (for example, for one hour) in the atmosphere or the like, the second member is layered on the first member and the electrode paste, and a layered body is thereby formed (Step S14).

In Step S14, the application of the electrode paste may be performed by any method other than the screen printing.

Further, in Step S14, instead of the second member, the green body of the second member (i.e., the precursor formed in Step S11) may be layered on the first member and the electrode paste. Alternatively, instead of the second member, a calcined body obtained by calcining the green body of the second member may be layered on the first member and the electrode paste. Furthermore, instead of the first member which is the sintered body, the green body or a calcined body of the first member may be used. In other words, the first member and the second member used in Step S14 may be any one of the sintered body, the calcined body, and the green body.

After that, by sintering the layered body formed in Step S14 by the hot-press method or the like, the first member and the second member are unified and the main body 21 and the electrode 23 (i.e., the composite sintered body 20) are formed (Step S15). Sintering conditions in Step S15 (for example, press pressure, sintering temperature, sintering time, and the like) are determined as appropriate. The sintering of the layered body in Step S15 may be performed by any method other than the hot-press method. In Step S14 described above, instead of the electrode paste, the electrode 23 which is formed by sintering the electrode paste alone may be disposed on the upper surface of the first member and the green body, the calcined body, or the sintered body of the second member may be layered on the first member and the electrode 23.

Next, with reference to Tables 1 to 3, Examples 1 to 16 of the composite sintered body 20 (i.e., the main body 21 and the electrode 23) in accordance with the present invention and composite sintered bodies of Comparative Examples 1 to 4 to be compared with the composite sintered body 20 will be described. The electrode 23 contains WC and TiN in Examples 1 to 16 while the electrode 23 contains only one of WC and TiN in Comparative Examples 1 to 4.

TABLE 1

| | Main Body | | | | | |
|---|---|---|---|---|---|---|
| | First Member (Lower Side) | Second Member (Upper Side) | Main Component | Additive Component | | Thermal Expansion Coefficient (ppm/K) |
| | | | | Component | Mass % | |
| Comparative Example 1 | Sintered Body | Green Body | AlN | MgO | 1 | 5.9 |
| Comparative Example 2 | Sintered Body | Green Body | AlN | MgO | 1 | 5.9 |
| Comparative Example 3 | Sintered Body | Green Body | AlN | MgAl$_2$O$_4$ | 45 | 7.1 |
| Comparative Example 4 | Sintered Body | Green Body | AlN | MgAl$_2$O$_4$ | 45 | 7.1 |
| Example 1 | Sintered Body | Green Body | AlN | MgO | 1 | 5.9 |
| Example 2 | Sintered Body | Green Body | AlN | MgAl$_2$O$_4$ | 5 | 5.5 |
| Example 3 | Sintered Body | Green Body | AlN | MgAl$_2$O$_4$ | 10 | 5.7 |
| Example 4 | Sintered Body | Green Body | AlN | MgAl$_2$O$_4$ | 20 | 6.1 |
| Example 5 | Sintered Body | Green Body | AlN | MgAl$_2$O$_4$ | 30 | 6.5 |
| Example 6 | Sintered Body | Green Body | AlN | MgAl$_2$O$_4$ | 45 | 7.1 |
| Example 7 | Sintered Body | Green Body | AlN | MgAl$_2$O$_4$ | 45 | 7.1 |
| Example 8 | Sintered Body | Green Body | AlN | MgAl$_2$O$_4$ | 45 | 7.1 |
| Example 9 | Sintered Body | Green Body | AlN | MgAl$_2$O$_4$ | 45 | 7.1 |
| Example 10 | Sintered Body | Green Body | AlN | MgAl$_2$O4 | 45 | 7.1 |
| Example 11 | Sintered Body | Green Body | AlN | MgAl$_2$O$_4$ | 45 | 7.1 |
| Example 12 | Sintered Body | Green Body | AlN | MgAl$_2$O$_4$ | 45 | 7.1 |
| Example 13 | Sintered Body | Green Body | AlN | MgAl$_2$O$_4$ | 45 | 7.1 |
| Example 14 | Sintered Body | Green Body | AlN | MgAl$_2$O$_4$ | 45 | 7.1 |
| Example 15 | Sintered Body | Green Body | AlN | MgAl$_2$O$_4$ | 45 | 7.1 |
| Example 16 | Sintered Body | Sintered Body | AlN | MgAl$_2$O$_4$ | 45 | 7.1 |

TABLE 2

| | Heater Electrode | | | | | | |
|---|---|---|---|---|---|---|---|
| | Constituent Component | | | | | | |
| | Component 1 | | | Component 2 | | | |
| | Component | Volume % | Thermal Expansion Coefficient (ppm/° C.) | Component | Volume % | Thermal Expansion Coefficient (ppm/° C.) | Thermal Expansion Coefficient (ppm/° C.) |
| Comparative Example 1 | WC | 100 | 5.3 | — | — | — | 5.3 |
| Comparative Example 2 | TiN | 100 | 9.2 | — | — | — | 9.2 |
| Comparative Example 3 | WC | 100 | 5.3 | — | — | — | 5.3 |
| Comparative Example 4 | TiN | 100 | 9.2 | — | — | — | 9.2 |
| Example 1 | WC | 84.4 | 5.3 | TiN | 15.6 | 9.2 | 5.9 |
| Example 2 | WC | 94.6 | 5.3 | TiN | 5.4 | 9.2 | 5.5 |
| Example 3 | WC | 89.5 | 5.3 | TiN | 10.5 | 9.2 | 5.7 |
| Example 4 | WC | 79.3 | 5.3 | TiN | 20.7 | 9.2 | 6.1 |
| Example 5 | WC | 69.1 | 5.3 | TiN | 30.9 | 9.2 | 6.5 |
| Example 6 | WC | 53.7 | 5.3 | TiN | 46.3 | 9.2 | 7.1 |
| Example 7 | WC | 66.5 | 5.3 | TiN | 33.5 | 9.2 | 6.6 |
| Example 8 | WC | 61.4 | 5.3 | TiN | 38.6 | 9.2 | 6.8 |
| Example 9 | WC | 56.3 | 5.3 | TiN | 43.7 | 9.2 | 7.0 |
| Example 10 | WC | 51.2 | 5.3 | TiN | 48.9 | 9.2 | 7.2 |
| Example 11 | WC | 46.0 | 5.3 | TiN | 54.0 | 9.2 | 7.4 |
| Example 12 | WC | 40.9 | 5.3 | TiN | 59.1 | 9.2 | 7.6 |
| Example 13 | WC | 53.7 | 5.3 | TiN | 46.3 | 9.2 | 7.1 |
| Example 14 | WC | 53.7 | 5.3 | TiN | 46.3 | 9.2 | 7.1 |
| Example 15 | WC | 53.7 | 5.3 | TiN | 46.3 | 9.2 | 7.1 |
| Example 16 | WC | 53.7 | 5.3 | TiN | 46.3 | 9.2 | 7.1 |

TABLE 3

| | Sintering Temperature (° C.) | CTE Difference (ppm/K) | WC—TiN Peak Ratio | TiN Sintered Particle Diameter (μm) | Resistivity of Electrode ×10$^{-5}$ (Ω · cm) |
|---|---|---|---|---|---|
| Comparative Example 1 | 1720 | 0.60 | — | — | 1.9 |
| Comparative Example 2 | 1720 | 3.30 | — | 7.01 | 5.1 |
| Comparative Example 3 | 1720 | 1.80 | — | — | 2.0 |
| Comparative Example 4 | 1720 | 2.10 | — | 7.06 | 5.4 |
| Example 1 | 1720 | 0.00 | 0.97 | 0.78 | 2.2 |
| Example 2 | 1720 | 0.00 | 0.99 | 0.74 | 2.4 |
| Example 3 | 1720 | 0.00 | 0.98 | 0.77 | 2.4 |
| Example 4 | 1720 | 0.00 | 0.96 | 0.79 | 2.3 |
| Example 5 | 1720 | 0.00 | 0.95 | 0.80 | 2.3 |
| Example 6 | 1720 | 0.00 | 0.91 | 0.82 | 2.2 |
| Example 7 | 1720 | 0.50 | 0.94 | 0.81 | 2.4 |
| Example 8 | 1720 | 0.30 | 0.93 | 0.82 | 2.3 |
| Example 9 | 1720 | 0.10 | 0.91 | 0.82 | 2.3 |
| Example 10 | 1720 | 0.10 | 0.90 | 0.84 | 2.2 |
| Example 11 | 1720 | 0.30 | 0.89 | 0.87 | 2.1 |
| Example 12 | 1720 | 0.50 | 0.88 | 0.96 | 2.1 |
| Example 13 | 1700 | 0.00 | 0.92 | 0.81 | 2.0 |
| Example 14 | 1740 | 0.00 | 0.86 | 0.83 | 2.5 |
| Example 15 | 1780 | 0.00 | 0.80 | 0.86 | 3.0 |
| Example 16 | 1720 | 0.00 | 0.91 | 0.81 | 2.2 |

In Examples 1 to 16 and Comparative Examples 1 to 4, manufacture of the main body 21 and the electrode 23 is performed by above-described Steps S11 to S15. In Examples 1 to 16 and Comparative Examples 1 to 4, in Step S11, as the AlN raw material, commercially-available high-purity fine powder of AlN (having an oxygen content of 0.8 percentage and an average particle diameter of 1.3 μm) is used. Further, as the MgO raw material, commercially-available high-purity fine powder of MgO (having a purity of 99% or higher and an average particle diameter of 1.2 μm) is used. As the $MgAl_2O_4$ raw material, used is a substance obtained by performing heating synthesis of a mixture of the above-described commercially-available MgO powder and commercially-available high-purity fine powder of aluminum oxide ($Al_2O_3$) (having a purity of 99.99% or higher and an average particle diameter of 0.5 μm) at a molar ratio of 1:1, at 1300° C. under the atmosphere, and then milling the mixture while adjusting the average particle diameter thereof to be 0.2 μm.

In Examples 1 to 16 and Comparative Examples 1 to 4, the wet mixing of the raw material powder in Step S11 is performed by a ball mill using zirconia balls and a poly pot. The mixing is performed for 20 hours and the used solvent is an organic solvent. The slurry generated by the wet mixing is dried and then sieved, to thereby obtain the raw material powder of the main body 21. Further, the formation of the green body in Step S11 is performed by filling the raw material powder into a die for uniaxial pressing. The pressure in the uniaxial pressing is 100 kgf/cm$^2$. The obtained green body has a substantially disk-like shape with a diameter of 50 mm and a thickness of 10 mm. Furthermore, in Examples 1 to 16 and Comparative Examples 1 to 4, a test body smaller than the actual composite sintered body 20 is formed and used.

In Examples 1 to 16 and Comparative Examples 1 to 4, the sintering in Step S12 is performed by the hot-press method. Specifically, the above-described green body is accommodated in a hot-press graphite mold and set in a hot press furnace, to perform the sintering. The press pressure in sintering is 200 kgf/cm$^2$. The sintering temperature (i.e., the maximum temperature in sintering) is not lower than 1700° C. and not higher than 1780° C. The sintering is performed for 8 hours. The rate of temperature rise and the rate of temperature fall are each 300° C./h. As to the sintering atmosphere, evacuation is performed in a temperature rise up to 1000° C., and after that, nitrogen gas is introduced. The gas pressure after introduction of nitrogen gas is maintained at about 1.5 atm (about 0.152 MPa). In a temperature fall, the temperature control is stopped at 1400° C. and furnace cooling is performed. The obtained sintered body (i.e., the first member and the second member) are each processed into a substantially disk-like shape with a diameter of 50 mm and a thickness of 5 mm.

In Examples 1 to 16 and Comparative Examples 1 to 4, in Step S13, as the WC raw material and the TiN raw material, commercially-available high-purity fine powder of WC (having a purity of 99.9% or higher and an average particle diameter of 0.75 μm) and commercially-available high-purity fine powder of TiN (having a purity of 99% or higher and an average particle diameter of 0.6 μm) are used, respectively.

In Examples 1 to 16, the wet mixing of the raw material powder in Step S13 is performed by the ball mill using the zirconia balls and the poly pot. The mixing is performed for 20 hours and the used solvent is an organic solvent. The slurry generated by the wet mixing is dried and then sieved, to thereby obtain the raw material powder of the electrode 23. In Comparative Examples 1 to 4, the WC raw material or the TiN raw material described above is used as the raw material powder of the electrode 23. In Examples 1 to 16 and Comparative Examples 1 to 4, as the solvent and the binder which are kneaded and mixed with the raw material powder in the generation of the electrode paste, butyl carbitol and n-butyl polymethacrylate are used.

In Examples 1 to 16 and Comparative Examples 1 to 4, the application of the electrode paste in Step S14 is performed by screen printing. The electrode paste applied on the first member has a substantially rectangular shape with a width of 5 mm and a length of 15 mm. The thickness of the electrode paste is 60 to 70 μm.

In Examples 1 to 16 and Comparative Examples 1 to 4, the sintering in Step S15 is performed by the hot-press method. Specifically, the above-described green body is accommodated in the hot-press graphite mold and set in the hot press furnace, to perform the sintering. The press pressure in sintering is 200 kgf/cm$^2$. The sintering temperature (i.e., the maximum temperature in sintering) is not lower than 1700° C. and not higher than 1780° C. The sintering is performed for 8 hours. The rate of temperature rise and the rate of temperature fall are each 300° C./h. As to the sintering atmosphere, evacuation is performed in a temperature rise up to 1000° C., and after that, nitrogen gas is introduced. The gas pressure after introduction of nitrogen gas is maintained at about 1.5 atm (about 0.152 MPa). In a temperature fall, the temperature control is stopped at 1400° C. and furnace cooling is performed.

In Tables 1 to 3, the thermal expansion coefficient of the base material (i.e., the main body 21) is measured by using a sintered body sample cut out from the main body 21, by a method in conformity with JIS-R1618, within a range not lower than 40° C. and not higher than 1000° C. Further, the thermal expansion coefficient of WC is measured by using a bulk material formed by performing hot-press sintering of commercially-available WC powder used in Step S13 at the same conditions as those in Step S12, by a method in conformity with JIS-R1618, within a range not lower than 40° C. and not higher than 1000° C. The thermal expansion coefficient of TiN is also measured in the same manner as that of WC. The thermal expansion coefficient of the electrode 23 is obtained on the basis of the thermal expansion coefficient of WC alone and the thermal expansion coefficient of TiN alone described above and the content percentage of WC and TiN in the electrode 23. Specifically, the sum of the product of the thermal expansion coefficient of WC alone and the content percentage of WC in the electrode 23 and the product of the thermal expansion coefficient of TiN alone and the content percentage of TiN in the electrode 23 is obtained as the thermal expansion coefficient of the electrode 23. The CTE difference is an absolute value of the difference between the thermal expansion coefficient of the electrode 23 and the thermal expansion coefficient of the main body 21 described above.

The resistivity of the electrode 23 is obtained as follows. First, a specimen having a substantially rectangular parallelepiped shape with a width, a length, and a thickness each of 9 mm is cut out from the composite sintered body 20 formed in Step S15. The specimen is cut out so that the electrode 23 having a width of 5 mm and a length of 9 mm can be incorporated in the center. The electrode 23 having a width of 5 mm is exposed in both end surfaces of the specimen. The cross-sectional area S (cm$^2$) of the electrode 23 is obtained by measuring the width and the length of the electrode 23 in the end surface of the specimen with an optical microscope. Further, the distance between both the end surfaces of the specimen in which the electrode 23 is exposed is measured by a vernier caliper, as the length L (cm) of the electrode 23. A circuit for resistance measurement is configured by applying a conductive paste on both the end surfaces of the electrode 23 and connecting a lead wire thereto. Then, at a room temperature in the atmosphere, a microcurrent I (mA) in a range from 0 to 150 mA is applied to the electrode 23 and a value of the micro voltage V (mV) generated at that time is measured, and the resistance R ($\Omega$) of the electrode 23 is obtained from R=V/I. After that, the resistivity $\rho$ ($\Omega$·cm) of the electrode 23 is obtained from $\rho$=R×S/L.

The composition of the electrode 23 is obtained as follows. First, an upper half or a lower half of the specimen is removed, to thereby expose an upper surface or a lower surface of the electrode 23, and the exposed electrode 23 is polished. Then, in the polished surface of the electrode 23, a crystal phase is identified by an X-ray diffraction apparatus (XRD). For the identification of the crystal phase, used is a sealed-tube X-ray diffraction apparatus (D8-ADVANCE manufactured by Bruker AXS). The measurement conditions are CuK$\alpha$, 40 kV, 40 mA, and 2$\theta$=10-70°, and the step width of the measurement is 0.002°.

The WC—TiN peak ratio in the electrode 23 is the intensity ratio of the main peak between WC and TiN, which is measured by the above-described XRD. The WC—TiN peak ratio is obtained as I1/(I1+I2) where I1 represents the intensity of a (100) plane which is a main peak of WC and I2 represents the intensity of a (200) plane which is a main peak of TiN.

Figure 3:
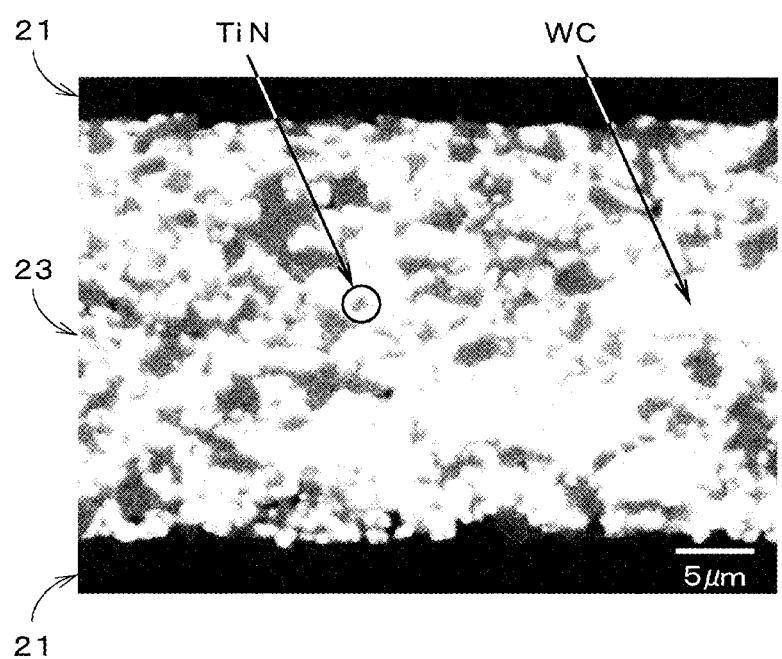
FIG. 3 is a SEM image of a polished surface of an electrode.

The sintered particle diameter of TiN in the electrode 23 is obtained by microstructure observation using the SEM. FIG. 3 is a SEM image of the electrode 23 in Example 6. Specifically, one surface of the specimen is polished to a mirror finishing, and the polished surface of the electrode 23 is observed by using the SEM. Then, an average diameter which is an average of the long diameter and the short diameter of each of a predetermined number (for example, several tens) of sintered particles is calculated, and an arithmetic average of the average diameter of a predetermined number of sintered particles is defined as the sintered particle diameter of TiN.

In Example 1 and Comparative Examples 1 and 2, the first member and the second member of the main body 21 are formed by adding MgO to AlN. In Examples 2 to 16 and Comparative Examples 3 and 4, the first member and the second member of the main body 21 are formed by adding MgAl$_2$O$_4$ to AlN. In Examples 1 to 15 and Comparative Examples 1 to 4, the second member is the green body in Step S11, and in Example 16, the second member is the sintered body in Step S12. Further, the first member is the sintered body in Step S12 in all Examples and all Comparative Examples.

In all Examples, the electrode 23 contains WC and TiN. Further, though there are some cases where the electrode 23 contains a slight amount of W$_2$C generated from WC, a slight amount of W$_2$C produces substantially no effect on the performance of the electrode 23. In Comparative Examples 1 and 3, the electrode 23 contains WC and does not contain TiN. In Comparative Examples 2 and 4, the electrode 23 contains TiN and does not contain WC. In Examples 1 to 12 and 16 and Comparative Examples 1 to 4, the sintering temperature of the electrode 23 is 1720° C. In Examples 13 to 15, the sintering temperatures of the electrode 23 are 1700° C., 1740° C., and 1780° C., respectively.

In Examples 1, 3, and 4, the thermal expansion coefficient of the main body 21 is approximated while the additive component in the main body 21 is changed between MgO and MgAl$_2$O$_4$. In Examples 2 to 6, while the content percentage of the additive component MgAl$_2$O$_4$ in the main body 21 is changed within a range from 5 mass percentage to 45 mass percentage, the respective content percentages of WC and TiN in the electrode 23 are changed so that CTE difference can become 0.00 ppm/° C. In Examples 7 to 12, while the content percentage of the additive component MgAl$_2$O$_4$ in the main body 21 is fixed to 45 mass percentage, the respective content percentages of WC and TiN in the electrode 23 are changed, to thereby change the CTE difference. In Examples 6 and 13 to 15, the sintering temperature is changed within a range from 1700° C. to 1780° C. In Examples 6 and 16, the second member of the main body 21 is the green body in Example 6 and the second member of the main body 21 is the sintered body in Example 16.

In Examples 1 to 16, the CTE difference which is an absolute value of the difference in the thermal expansion coefficient between the electrode 23 and the main body 21 is small, specifically in a range from 0.00 ppm/° C. to 0.50 ppm/° C., even though the thermal expansion coefficient of the main body 21 is changed due to the additive component. On the other hand, in Comparative Examples 1 and 3 in which the electrode 23 is formed of only WC, the CTE difference is large, specifically in a range from 0.60 ppm/° C. to 1.80 ppm/° C. Further, in Comparative Examples 2 and 4 in which the electrode 23 is formed of only TiN, the CTE difference is large, specifically in a range from 2.10 ppm/° C. to 3.30 ppm/° C.

In Examples 1 to 16, the WC—TiN peak ratio in the electrode 23 is in a range from 0.80 to 0.99. Further, in Comparative Examples 1 and 3 in which the electrode 23 is formed of only WC, the WC—TiN peak ratio in the electrode 23 is 1.0, and in Comparative Examples 2 and 4 in which the electrode 23 is formed of only TiN, the WC—TiN peak ratio in the electrode 23 is 0.0.

In Examples 1 to 16, the sintered particle diameter of TiN in the electrode 23 is small, specifically in a range from 0.74 $\mu$m to 0.96 $\mu$m. On the other hand, in Comparative Examples 2 and 4 in which the electrode 23 is formed of only TiN, the sintered particle diameter of TiN in the electrode 23 is large, specifically in a range from 7.01 $\mu$m to 7.06 $\mu$m. In Comparative Examples 2 and 4, since the electrode 23 does not contain WC, it is thought that the abnormal grain growth of TiN occurs when the electrode 23 is sintered.

In Examples 1 to 16, the resistivity of the electrode 23 at the room temperature is small, specifically in a range from $2.0 \times 10^{-5}$ $\Omega$·cm to $3.0 \times 10^{-5}$ $\Omega$·cm. In Comparative Examples 1 and 3 in which the electrode 23 is formed of only WC, the resistivity of the electrode 23 at the room temperature is in a range from $1.9 \times 10^{-5}$ $\Omega$·cm to $2.0 \times 10^{-5}$ $\Omega$·cm. On the other hand, in Comparative Examples 2 and 4 in which the electrode 23 is formed of only TiN, the resistivity of the electrode 23 at the room temperature is large, specifically in a range from $5.1 \times 10^{-5}$ $\Omega$·cm to $5.4 \times 10^{-5}$ $\Omega$·cm.

As described thus far, the composite sintered body 20 includes the base material (i.e., the main body 21) using ceramics as a main material and the electrode 23 disposed inside the main body 21. The electrode 23 contains WC and TiN. It is thereby possible to reduce the difference in the thermal expansion coefficient between the electrode 23 and the main body 21 while suppressing an increase in the resistivity of the electrode 23. As a result, it is possible to suppress any damage such as a crack, a breakage, or the like of the main body 21, which is caused by the difference in the thermal expansion coefficient. Further, in the case where the electrode 23 is used as the resistance heating element, it is possible to increase the calorific value due to the electrode 23. In the case where the electrode 23 is used as the chuck electrode, it is possible to increase the adsorption force for the substrate 9.

Further, in the composite sintered body 20, the electrode 23 may be disposed on the surface of the main body 21. In other words, the electrode 23 is disposed inside the main body 21 or on the surface thereof. Even in a case where the electrode 23 is disposed inside the main body 21 or on the surface thereof, in the composite sintered body 20, it is possible to reduce the difference in the thermal expansion coefficient between the electrode 23 and the main body 21 while suppressing the increase in the resistivity of the electrode 23, as described above.

As described above, in the composite sintered body 20, it is preferable that the absolute value of the difference (i.e., the CTE difference) in the thermal expansion coefficient between the electrode 23 and the main body 21 should be not higher than 0.3 ppm/° C. within a range not lower than 40° C. and not higher than 1000° C. Thus, by suitably reducing the difference in the thermal expansion coefficient between the electrode 23 and the main body 21, it is possible to further suppress any damage of the main body 21 due to the difference in the thermal expansion coefficient.

As described above, it is preferable that the resistivity of the electrode 23 at the room temperature should be not higher than $3.0 \times 10^{-5}$ $\Omega \cdot$cm. Thus, by suitably reducing the resistivity of the electrode 23, it is possible to further increase the calorific value due to the electrode 23 when the electrode 23 is used as the resistance heating element. Further, it is possible to further increase the adsorption force for the substrate 9 when the electrode 23 is used as the chuck electrode.

As described above, it is preferable that the content percentage of TiN in the conductor included in the electrode 23 should be not lower than 5 volume percentage and not higher than 60 volume percentage. It is thereby possible to suitably reduce the difference in the thermal expansion coefficient between the electrode 23 and the main body 21 while suitably suppressing the increase in the resistivity of the electrode 23, as shown in above-described Examples 1 to 16.

As described above, in the electrode 23, it is preferable that the intensity ratio (i.e., the WC—TiN peak ratio) of the main peak between WC and TiN, which is obtained by the X-ray diffraction method, should be not lower than 0.80 and lower than 1.0. It is thereby possible to suitably reduce the difference in the thermal expansion coefficient between the electrode 23 and the main body 21 while suitably suppressing the increase in the resistivity of the electrode 23, as shown in above-described Examples 1 to 16.

As described above, it is preferable that the total content percentage of WC and TiN in the conductor included in the electrode 23 should be 100 volume percentage. It is thereby possible to prevent an increase in manufacturing cost due to an increase in the kinds of material of the conductor in the electrode 23. More preferably, the total content percentage of WC and TiN in the electrode 23 is 100 volume percentage. It is thereby possible to suppress the increase in the resistivity of the electrode 23 as compared with the case where the electrode 23 includes any material other than the conductor (for example, the material of the main body 21).

As described above, it is preferable that the sintered particle diameter of TiN in the electrode 23 should be not smaller than 0.7 μm and not larger than 1.0 μm. Thus, by suppressing the abnormal grain growth of TiN, it is possible to densify the electrode 23. As a result, it is possible to suitably suppress the increase in the resistivity of the electrode 23.

As described above, it is preferable that the main material of the main body 21 should be AlN. It is thereby possible to provide the composite sintered body 20 having high versatility, which can be used for various processings.

As described above, since it is possible to reduce the difference in the thermal expansion coefficient between the electrode 23 and the main body 21 while suppressing the increase in the resistivity of the electrode 23 in the composite sintered body 20, the composite sintered body 20 is suitable for the semiconductor manufacturing apparatus member to be used in the semiconductor manufacturing apparatus. The composite sintered body 20 is especially suitable for a semiconductor manufacturing apparatus member to be used in a high-power semiconductor manufacturing apparatus such as a high-power etching apparatus or the like. As a preferable example of the semiconductor manufacturing apparatus member formed by using the composite sintered body 20, the above-described susceptor 1 may be adopted. In the susceptor 1, as described above, the main body 21 has a disk-like shape and the semiconductor substrate is placed on the main surface of the main body 21.

The above-described method of manufacturing the composite sintered body 20 includes a step (Steps S11 to S12) of preparing the first member and the second member each of which is a green body, a calcined body, or a sintered body, which uses ceramics as a main material, a step (Step S14) of disposing the electrode 23 or the precursor of the electrode 23 including WC and TiN on the first member and then forming a layered body by layering the second member thereon, and a step (Step S15) of performing hot-press sintering of the layered body. It is thereby possible to reduce the difference in the thermal expansion coefficient between the electrode 23 and the main body 21 while suppressing the increase in the resistivity of the electrode 23, like in the above description. As a result, it is possible to suppress any damage such as a crack, a breakage, or the like of the main body 21, which is caused by the difference in the thermal expansion coefficient. Further, in the case where the electrode 23 is used as the resistance heating element, it is possible to increase the calorific value due to the electrode 23. In the case where the electrode 23 is used as the chuck electrode, it is possible to increase the adsorption force for the substrate 9.

As described above, it is preferable that the absolute value of the difference (i.e., the CTE difference) in the thermal expansion coefficient between the electrode 23 and the first member and the second member after the end of Step S15 should be not higher than 0.3 ppm/° C. within a range not lower than 40° C. and not higher than 1000° C. Thus, by suitably reducing the difference in the thermal expansion coefficient between the electrode 23 and the first member and the second member, it is possible to further suppress any damage of the first member and the second member (i.e., the main body 21) due to the difference in the thermal expansion coefficient.

As described above, it is preferable that the sintering temperature in Step S15 should be not lower than 1700° C. and not higher than 1780° C. In the composite sintered body 20, even in such high-temperature sintering, it is possible to suppress the abnormal grain growth of TiN and increase the denseness of the electrode 23.

In the composite sintered body 20 and the method of manufacturing the composite sintered body 20 which are described above, various modifications can be made.

For example, the content percentage of TiN in the conductor included in the electrode 23 may be lower than 5 volume percentage or may be higher than 60 volume percentage.

In the electrode 23, the intensity ratio of the main peak (i.e., the WC—TiN peak ratio) between WC and TiN, which is obtained by the X-ray diffraction method, may be lower than 0.80.

The sintered particle diameter of TiN in the electrode 23 may be smaller than 0.7 μm or may be larger than 1.0 μm.

The resistivity of the electrode 23 at the room temperature may be higher than $3.0 \times 10^{-5}$ Ω·cm.

The absolute value of the difference in the thermal expansion coefficient (i.e., the CTE difference) between the electrode 23 and the main body 21 may be higher than 0.3 ppm/° C. within the range not lower than 40° C. and not higher than 1000° C.

The main material of the main body 21 may be ceramics other than AlN.

The conductor of the electrode 23 may include a material other than WC or TiN. In other words, the total content percentage of WC and TiN in the conductor may be lower than 100 volume percentage. Further, the electrode 23 may include a material (e.g., the ceramics such as AlN or the like) which is the main material of the main body 21) other than the conductor. In other words, the content percentage of the conductor in the electrode 23 may be lower than 100 volume percentage.

In the method of manufacturing the composite sintered body 20, the sintering temperature in Step S15 may be lower than 1700° C. or may be higher than 1780° C.

In the susceptor 1, the electrode 23 may be an RF electrode for plasma treatment.

The composite sintered body 20 may be also used for forming a semiconductor manufacturing apparatus member (for example, a ring, a shower head, or the like) provided in a semiconductor manufacturing apparatus, other than the susceptor 1. Further, a member used in an apparatus other than the semiconductor manufacturing apparatus may be formed of the composite sintered body 20. For example, the composite sintered body 20 may be used for forming a susceptor for supporting a substrate other than the semiconductor substrate, and may be used for forming a ceramic heater for heating an object.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

INDUSTRIAL APPLICABILITY

The present invention can be used in fields relating to a semiconductor manufacturing apparatus, for example, manufacture of a susceptor for holding and heating a semiconductor substrate.

REFERENCE SIGNS LIST

9 Substrate
20 Composite Sintered Body
21 Main body
23 Electrode
S11 to S15 Step

The invention claimed is:

1. A composite sintered body, comprising:
a base material using ceramics as a main material; and
an electrode disposed inside said base material or on a surface thereof,
wherein said electrode contains
tungsten carbide; and
titanium nitride, and
wherein an absolute value of the difference in thermal expansion coefficient between said electrode and said base material is not higher than 0.3 ppm/° C. within a range not lower than 40° C. and nut higher than 1000° C.

2. The composite sintered body according to claim 1, wherein
the resistivity of said electrode at a room temperature is not higher than $3.0 \times 10^{-5}$ Ω·cm.

3. The composite sintered body according to claim 1, wherein
the content percentage of said titanium nitride in a conductor included in said electrode is not lower than 5 volume percentage and not higher than 60 volume percentage.

4. The composite sintered body according to claim 1, wherein
the intensity ratio of main peak between said tungsten carbide and said titanium nitride, which is obtained by the X-ray diffraction method, is not lower than 0.80 and lower than 1.0 in said electrode.

5. The composite sintered body according to claim 1, wherein
the total content percentage of said tungsten carbide and said titanium nitride in a conductor included in said electrode is 100 volume percentage.

6. The composite sintered body according to claim 5, wherein
the total content percentage of said tungsten carbide and said titanium nitride in said electrode is 100 volume percentage.

7. The composite sintered body according to claim 1, wherein
the sintered particle diameter of said titanium nitride in said electrode is not smaller than 0.7 μm and not larger than 1.0 μm.

8. The composite sintered body according to claim 1, wherein
said main material of said base material is aluminum nitride.

9. The composite sintered body according to claim 1, wherein
said base material has a disk-like shape, and
a semiconductor substrate is placed on a main surface of said base material.

10. A method of manufacturing a composite sintered body, comprising:
a) preparing a first member and a second member each of which is a green body, a calcined body, or a sintered body, which uses ceramics as a main material;
b) disposing an electrode or a precursor of said electrode including tungsten carbide and titanium nitride on said first member and then forming a layered body by layering said second member thereon; and
c) performing hot-press sintering of said layered body, and
wherein an absolute value of the difference in thermal expansion coefficient between said electrode and said first member and said second member after the end of said operation c) is not higher than 0.3 ppm/° C. within a range not lower than 40° C. and not higher than 1000° C.

11. The method of manufacturing a composite sintered body according to claim 10, wherein
a sintering temperature in said operation c) is not lower than 1700° C. and not higher than 1780° C.

\* \* \* \* \*